(12) United States Patent
Hsieh

(10) Patent No.: US 8,084,853 B2
(45) Date of Patent: Dec. 27, 2011

(54) SEMICONDUCTOR FLIP CHIP PACKAGE UTILIZING WIRE BONDING FOR NET SWITCHING

(75) Inventor: Tung-Hsien Hsieh, Changhua County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 63 days.

(21) Appl. No.: 12/621,505

(22) Filed: Nov. 19, 2009

(65) Prior Publication Data

US 2011/0074008 A1   Mar. 31, 2011

Related U.S. Application Data

(60) Provisional application No. 61/245,675, filed on Sep. 25, 2009.

(51) Int. Cl.
*H01L 23/528*   (2006.01)

(52) U.S. Cl. .................... 257/692; 257/E23.151

(58) Field of Classification Search .............. 257/692, 257/686, 777, 778, E23.141, 779
See application file for complete search history.

(56) References Cited

U.S. PATENT DOCUMENTS

| | | | |
|---|---|---|---|
| 7,808,075 B1 * | 10/2010 | Cheng et al. | 257/528 |
| 2003/0173111 A1 * | 9/2003 | Frutschy et al. | 174/260 |
| 2009/0121221 A1 * | 5/2009 | Lin | 257/48 |
| 2009/0134391 A1 * | 5/2009 | Lin | 257/48 |
| 2009/0269883 A1 * | 10/2009 | Walter et al. | 438/108 |
| 2010/0127360 A1 * | 5/2010 | Pagaila et al. | 257/659 |
| 2010/0148352 A1 * | 6/2010 | Moden | 257/692 |
| 2010/0320586 A1 * | 12/2010 | Bathan et al. | 257/690 |
| 2011/0031634 A1 * | 2/2011 | Pagaila | 257/777 |
| 2011/0037154 A1 * | 2/2011 | Shim et al. | 257/676 |

* cited by examiner

*Primary Examiner* — Nathan Ha
(74) *Attorney, Agent, or Firm* — Winston Hsu; Scott Margo

(57) ABSTRACT

This invention provides a semiconductor flip chip package including a carrier substrate and a flip chip mounted on the carrier substrate. The flip chip comprises a first input/output (I/O) pad and a second I/O pad on an active surface of the flip chip, wherein a switching between the first I/O pad and the second I/O pad is implemented by wire bonding.

23 Claims, 4 Drawing Sheets

1
SEMICONDUCTOR FLIP CHIP PACKAGE UTILIZING WIRE BONDING FOR NET SWITCHING

CROSS REFERENCE TO RELATED APPLICATIONS

This application claims the benefit of U.S. provisional application No. 61/245,675 filed Sep. 25, 2009.

BACKGROUND OF THE INVENTION

1. Field of the Invention

The present invention relates generally to semiconductor packaging. More particularly, the present invention relates to a semiconductor flip chip package utilizing wire bonding for net switching.

2. Description of the Prior Art

Flip chip technology is widely used in a variety of consumer products where form factor is key, for example, mobile phones, camcorders or personal digital assistants (PDAs). The adoption of flip chip package in many applications is driven by performance needs and the ability to achieve smaller die with a flip chip design. The smaller die translates into a greater number of die per wafer. While the flip chip assembly benefits high performing devices, its cost is the major challenge for main stream applications. Thus, major efforts continue to be made to reduce costs.

FIG. 1 is a perspective top view of a flip chip package with a specific bump option according to the prior art. FIG. 2 is a schematic, cross-sectional diagram taken along line I-I' of FIG. 1. As shown in FIG. 1 and FIG. 2, the prior art flip chip package 1 comprises a carrier substrate 2 and a flip chip 3 mounted on a top surface of the carrier substrate 2. The flip chip 3 is electrically coupled to the carrier substrate 2 through a plurality of bumps 4 which are applied to an active surface of the flip chip 3 according to the specific bump option. In a multiple I/O-to-1 ball case, for example, two bump sites 5a and 5b disposed on the active surface of the flip chip 3 are aligned correspondingly with two pads 6a and 6b provided on the top surface of the carrier substrate 2.

The two pads 6a and 6b are electrically coupled to the same solder ball 7 on a bottom side of the carrier substrate 2 by way of the common circuit trace 6c. According to the specific bump option, the bump site 5b is empty, that is, no bump is formed on the non-selected bump site 5b, while a bump 4a is applied to the selected bump site 5a, whereby a specific function of the flip chip package can be determined according to the specific bump option.

The above-described prior art flip chip package is costly partly because each of the bump options requires a different bumping mask. In addition, IC design houses usually encounter annoying die version management problem when keeping the die for flip chip assembly in stock. This is because different bump options result in different die versions. Due to the nature of the flip chip package, once the bump option is used and the die version is determined, there is no way to change or rework.

SUMMARY OF THE INVENTION

It is one object of this invention to provide an improved semiconductor flip chip package utilizing wire bonding for net switching in order to solve the above-mentioned prior art problems and drawbacks.

According to one aspect of the claimed invention, a semiconductor flip chip package includes a carrier substrate; a flip chip electrically coupled to the carrier substrate by a plurality of interconnections; a first input/output (I/O) terminal of the semiconductor flip chip package; and a bond wire electrically coupling the first I/O terminal to a first interconnection of the plurality of interconnections at a first surface of the carrier substrate.

In another aspect, a semiconductor flip chip package includes a carrier substrate and a flip chip mounted on the carrier substrate. The flip chip comprises a first input/output (I/O) pad and a second I/O pad on an active surface of the flip chip, wherein a switching between the first I/O pad and the second I/O pad is implemented by wire bonding.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
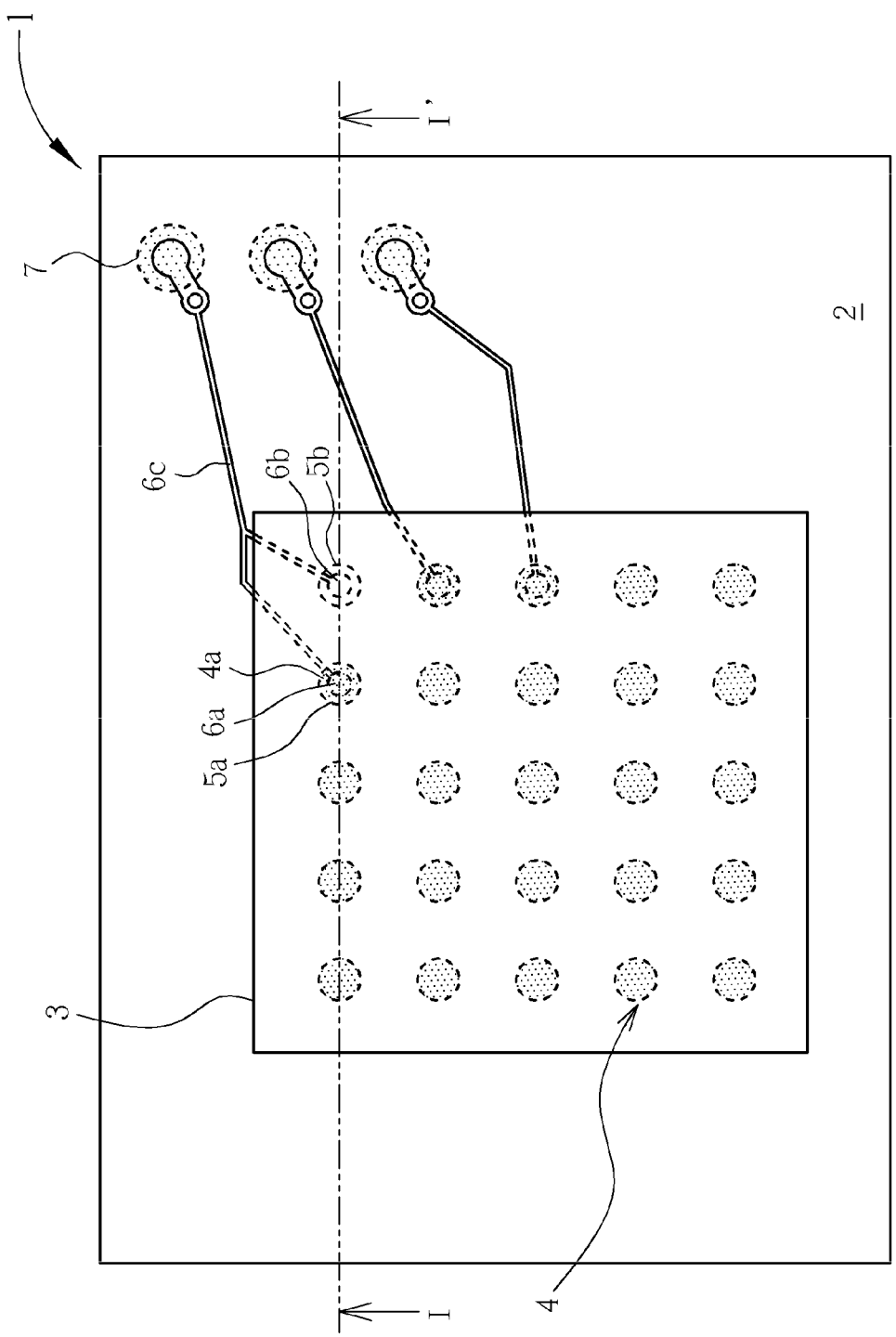
FIG. 1 is a perspective top view of a flip chip package with a specific bump option according to the prior art.
Figure 2:
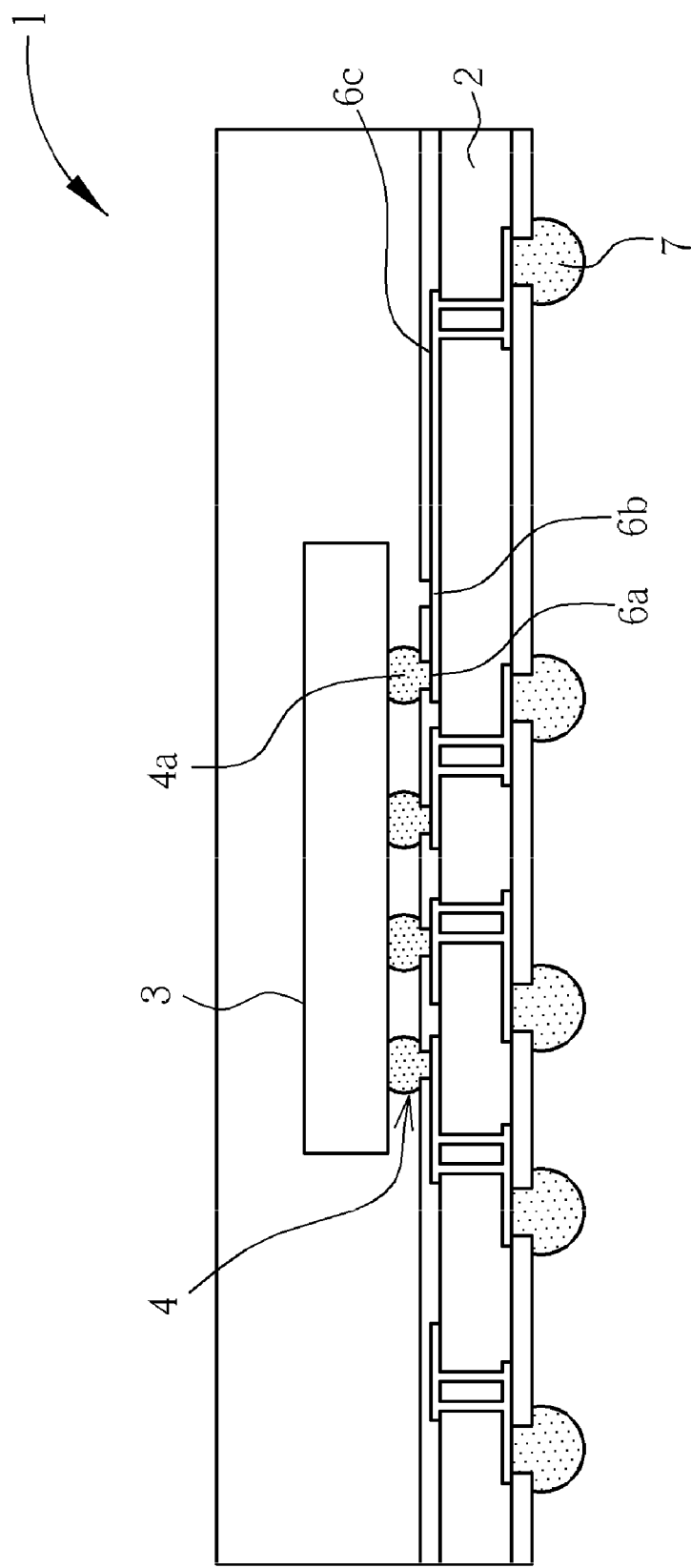
FIG. 2 is a schematic, cross-sectional view taken along line I-I' of FIG. 1.
Figure 3:
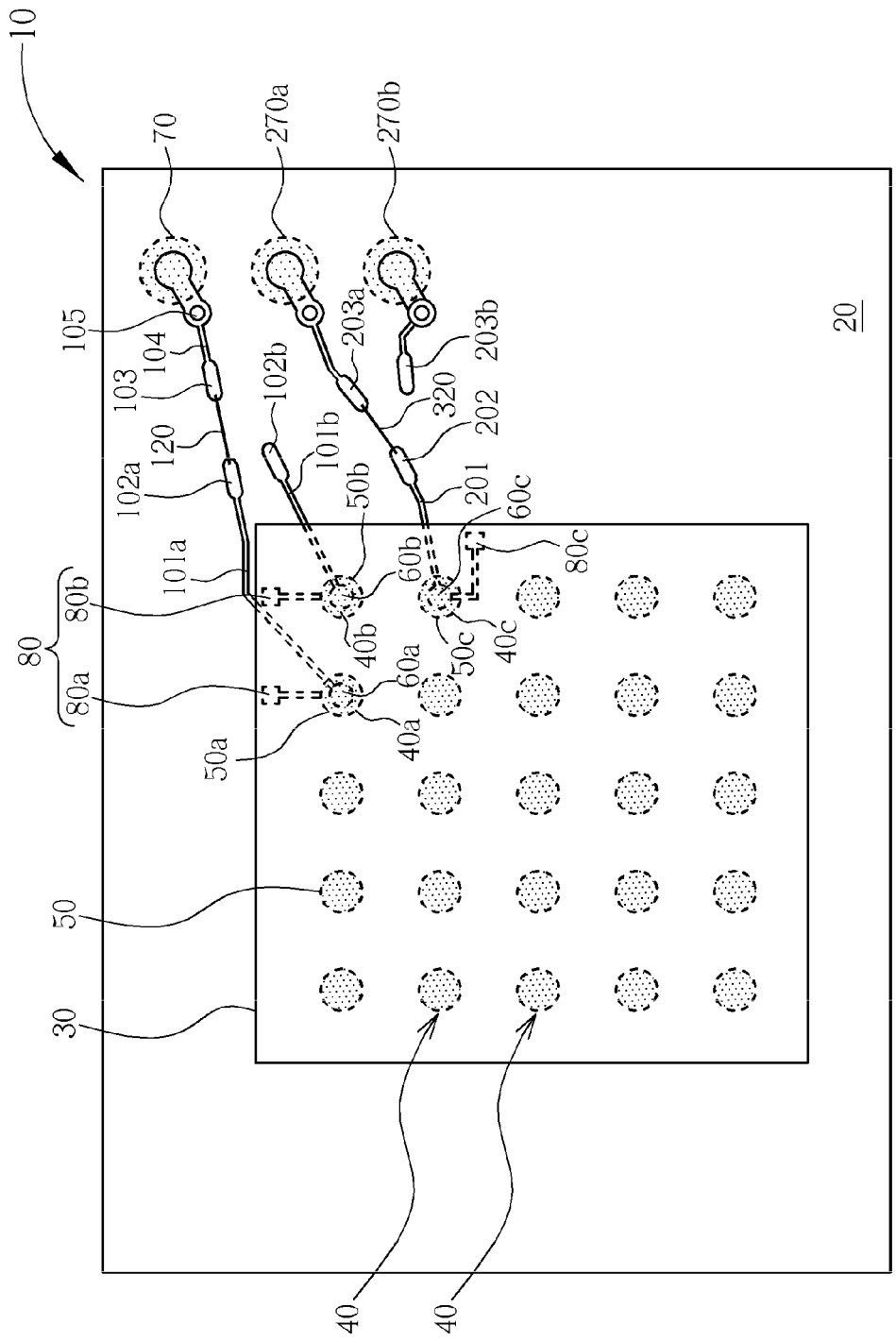
FIG. 3 is a perspective top view of a flip chip package in accordance with one embodiment of this invention.
Figure 4:
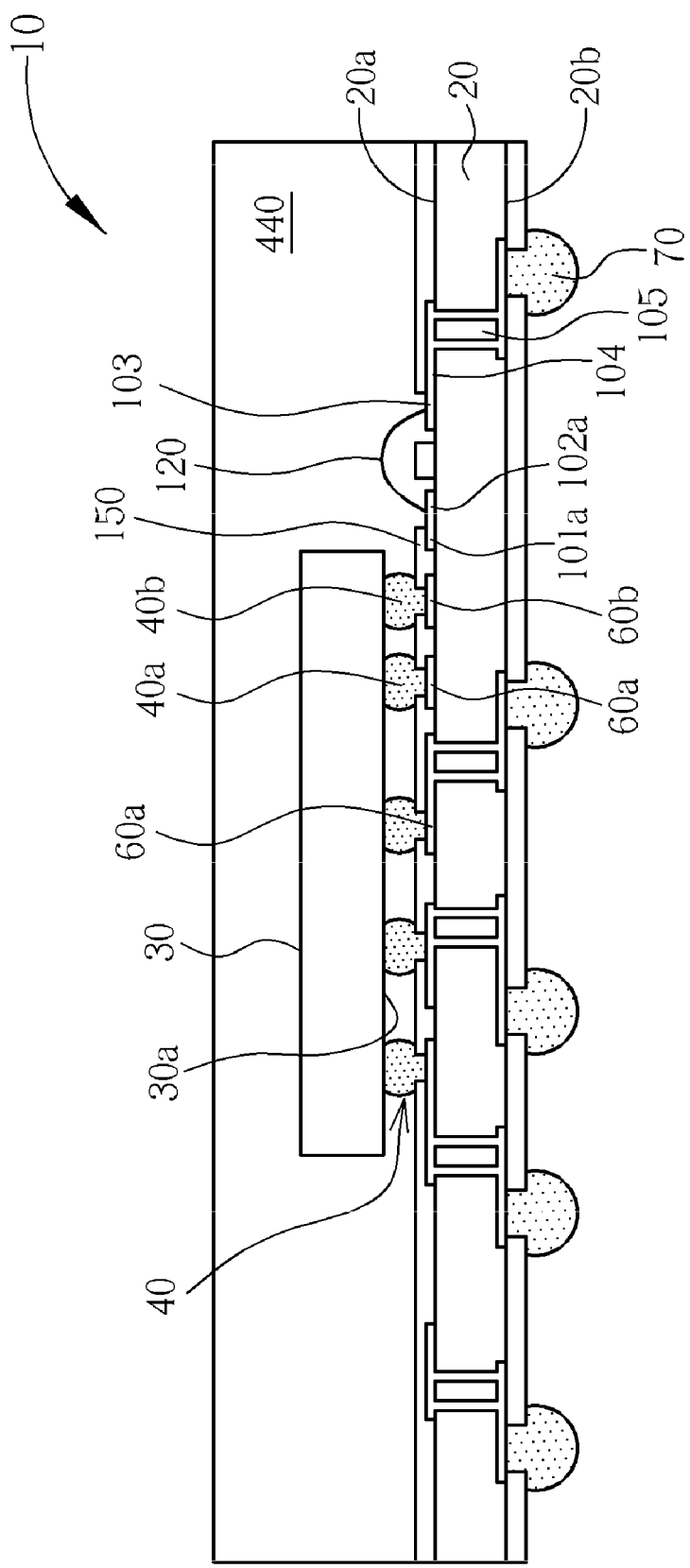
FIG. 4 is a schematic, cross-sectional view of the flip chip package of FIG. 3.

Please refer to FIG. 3 and FIG. 4. FIG. 3 is a perspective top view of a flip chip package in accordance with one embodiment of this invention. FIG. 4 is a schematic, cross-sectional view of the flip chip package depicted in FIG. 3. As shown in FIG. 3 and FIG. 4, the flip chip package 10 comprises a carrier substrate 20 and a flip chip 30 mounted on a first surface 20a of the carrier substrate 20. The flip chip 30 electrically couples to the carrier substrate 20 by a plurality of interconnections. In this embodiment, the interconnection includes a bump, such as 40, 40a or 40b, electrically coupled to the flip chip 30, and a pad, such as 60a or 60b on the first surface 20a, wherein the pad is electrically coupled to the bump. However, the interconnection could be of any other structures capable of providing electrical interconnection between the flip chip 30 and the carrier substrate 20, such as a copper pillar or the like. The carrier substrate 20 may be any type of IC carrier substrate or chip carrier that is suited for flip chip assembly. For example, the carrier substrate 20 may be a printed wiring board (PWB). In this embodiment, the flip chip 30 could be encapsulated by an encapsulation 440 such as molding compound or an underfill. The encapsulation 440 or the underfill could also cover at least a portion of the first surface 20a of the carrier substrate 20.

Likewise, the flip chip 30 could be electrically coupled to the carrier substrate 20 through a plurality of bumps 40 which are applied to an active surface 30a of the flip chip 30. The plurality of bumps 40 could be formed on corresponding bump sites 50 defined on the active surface 30a of the flip chip 30.

According to the embodiment of this invention, the bump sites 50 are redistributed layer (RDL) bump pads and are electrically coupled to corresponding input/output (I/O) pads 80 disposed along the periphery of the active surface 30a of the flip chip 30. Although in this embodiment, the I/O pads are disposed at the periphery of the flip chip 30, at least a portion of them could be alternatively disposed at the central area of the flip chip 30. The RDL process is a commonplace in this industry and thus the details are omitted. It is to be understood that this invention can be applicable to a non-RDL chip or die.

By way of example, two bump sites 50a and 50b disposed on the active surface 30a of the flip chip 30 are aligned correspondingly with two pads 60a and 60b provided on the first surface 20a of the carrier substrate 20. The two bump sites 50a and 50b are redistributed and originated from the I/O pads 80a and 80b, respectively. The two bump sites 50a and 50b correspond to the same input/output (I/O terminal) of the semiconductor package 10, such as solder ball 70 or a lead. Both of the two bump sites 50a and 50b are implanted with bumps 40a and 40b, respectively, such that the bump site 50a is electrically coupled to the pad 60a through the bump 40a and the bump site 50b is electrically coupled to the pad 60b through the bump 40b. The bump 40a, bump site 50a and pad 60a correspond to the I/O pad 80a. The bump 40b, bump site 50b and pad 60b correspond to the I/O pad 80b.

The pad 60a and pad 60b are electrically coupled to a wire-bonding finger 102a and a wire-bonding finger 102b through a circuit trace 101a and a circuit trace 101b, respectively. The pads 60a and 60b, the circuit traces 101a and 101b, and the wire-bonding fingers 102a and 102b are formed on the first surface of the carrier substrate 20. In one embodiment, a solder resist layer 150 may be provided on the first surface 20a of the carrier substrate 20 to mask the circuit traces 101a and 101b, while exposing the pads 60a and 60b and wire-bonding fingers 102a and 102b. A surface treatment layer, such as an organic solder protection (OSP) layer, an Electroless Nickel Electroless Palladium Immersion Gold (ENEPIG) layer, a nickel/gold layer, combination thereof or the like, may be formed on the exposed surfaces of the pads 60a and 60b and wire-bonding fingers 102a and 102b to protect them from oxidation.

A wire-bonding finger 103 may be disposed in proximity to the wire-bonding fingers 102a and 102b. The wire-bonding finger 103 is electrically coupled to an I/O terminal of the semiconductor package 10, such as a solder ball 70 or a lead, disposed on the second surface 20b of the carrier substrate 20 through the circuit trace 104 and the plated through hole (PTH) 105.

Assuming that the I/O pad 80a is selected and the I/O pad 80b is not selected, a bond wire 120 is provided between the wire-bonding finger 102a and the wire-bonding finger 103 that electrically couples to the corresponding solder ball 70, whereby the selected I/O pad 80a and the solder ball 70 are electrically coupled together. The non-selected I/O pad 80b and its redistributed bump site 50b are therefore electrically floating in this flip chip package. The bond wire 120 may be copper wire or gold wire. According to the embodiment of this invention, at least a portion of the bond wire 120 is covered by the encapsulation 440.

As described above, according to the prior art, in order to switch between the I/O pads 80a and 80b, one of the bump sites 50a and 50b is set empty and is therefore not implanted with any bump thereon. The prior art approach is thus not flexible and is costly due to that additional photomasks are necessary for other bumping options. This invention addresses these problems.

It is one feature of the embodiment of this invention that there could be only one bumping option for the flip chip package. That is, the same bump distribution may apply to different connection requirements of the chips. The switching between the I/O pads, for example, pads 80a and 80b, is done by wire bonding according to a specific bonding option. Therefore, it is more flexible. Further, since only one bumping option is applied, a great expense of additional photomasks for different bumping version or options is spared and the annoying die version management problem is solved.

In addition to the above-described multiple I/O-to-one I/O terminal of package, such as ball or lead, configuration, this invention can be applicable to one I/O-to-multiple I/O terminal of package, such as ball or lead, configuration. Furthermore, multiple I/O-to-multiple I/O terminal of package could be implemented with this invention as well. FIG. 3 also demonstrates one I/O-to-multiple I/O terminal of package configuration. As shown in FIG. 3, a bump site 50c corresponding to the I/O pad 80c is implanted with a bump 40c that is electrically coupled to an underlying pad 60c disposed on a first surface 20a of the carrier substrate 20. The pad 60c is electrically coupled to a wire-bonding finger 202 through a circuit trace 201.

Two wire-bonding fingers 203a and 203b may be disposed in proximity to the wire-bonding finger 202. The wire-bonding finger 203a may correspond to an I/O terminal of package, such as solder ball 270a or a lead, while the wire-bonding finger 203b may correspond to an I/O terminal of package, such as solder ball 270b or a lead. Analogously, the switching between the solder balls 270a and 207b corresponding to the same I/O pad 80c is done by wire bonding. For example, if the solder ball 270a is selected while the solder ball 270b is not selected, a finger-to-finger bond wire 320 is provided between the wire-bonding finger 202 and the wire-bonding finger 203a, thus leaving the wire-bonding finger 203b and the solder ball 270b electrically floating.

Though the I/O terminals of the package shown in the embodiments above are solder balls, this invention applies to packages with leads as I/O terminals, such as low-profile quad flat package (LQFP), quad flat non-leaded (QFN) package etc., as well.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor flip chip package, comprising:
   a carrier substrate;
   a flip chip electrically coupled to said carrier substrate by a plurality of interconnections;
   a first input/output (I/O) terminal of said semiconductor flip chip package; and
   a bond wire electrically coupling said first I/O terminal to a first interconnection of said plurality of interconnections at a first surface of said carrier substrate.

2. The semiconductor flip chip package according to claim 1 further comprising:
   a second I/O terminal of said semiconductor flip chip package;
   wherein said bond wire selectively couples said first I/O terminal or said second I/O terminal to said first interconnection.

3. The semiconductor flip chip package according to claim 1, wherein said bond wire selectively couples said first I/O terminal to said first interconnection or a second interconnection of said plurality of interconnections at said first surface of said carrier substrate.

4. The semiconductor flip chip package according to claim 1, wherein said first interconnection comprises:
   a first bump electrically coupled to said flip chip; and
   a first pad on said first surface of said carrier substrate, wherein said first pad is electrically coupled to said first bump;
   wherein said bond wire electrically couples said first pad and said first I/O terminal.

5. The semiconductor flip chip package according to claim 4 further comprising:
   a first wire-bonding finger on said first surface of said carrier substrate electrically coupled to said first pad;
   a second wire-bonding finger on said first surface of said carrier substrate electrically coupled to said first I/O terminal;
   wherein said bond wire is electrically coupled between said first wire-bonding finger and said second wire-bonding finger.

6. The semiconductor flip chip package according to claim 3, wherein
   said first interconnection comprises:
      a first bump electrically coupled to said flip chip; and
      a first pad on said first surface of said carrier substrate, wherein said first pad is electrically coupled to said first bump; and
   said second interconnection comprises:
      a second bump electrically coupled to said flip chip; and
      a second pad on said first surface of said carrier substrate, wherein said second pad is electrically coupled to said second bump;
   wherein said bond wire selectively couples said first pad or said second pad to said first I/O terminal.

7. The semiconductor flip chip package according to claim 6, further comprising:
   a first wire-bonding finger on said first surface of said carrier substrate electrically coupled to said first pad;
   a second wire-bonding finger on said first surface of said carrier substrate electrically coupled to said first I/O terminal; and
   a third wire-bonding finger on said first surface of said carrier substrate electrically coupled to said second pad;
   wherein said bond wire is selectively coupled between said first wire-bonding finger and said second wire-bonding finger or between said third wire-bonding finger and said second wire-bonding finger.

8. The semiconductor flip chip package according to claim 1 wherein said flip chip is encapsulated by an encapsulation.

9. The semiconductor flip chip package according to claim 8 wherein said encapsulation covers at least a portion of said first surface of said carrier substrate.

10. The semiconductor flip chip package according to claim 8 wherein said encapsulation covers at least a portion of said bond wire.

11. The semiconductor flip chip package according to claim 1 wherein said first I/O terminal is a solder ball disposed on a second surface of said carrier substrate.

12. The semiconductor flip chip package according to claim 11 wherein said carrier substrate is a printed wiring board.

13. The semiconductor flip chip package according to claim 1 wherein said bond wire is made of aluminum, copper, gold or a combination thereof.

14. The semiconductor flip chip package according to claim 7 wherein said first and second pads and said first and second wire-bonding fingers are made of aluminum, copper, gold or a combination thereof.

15. The semiconductor flip chip package according to claim 14, further comprising a surface treatment layer on said first and second pads and said first and second wire-bonding fingers, wherein said surface treatment layer is made of an Electroless Nickel Electroless Palladium Immersion Gold (ENEPIG) layer, a nickel/gold layer or a combination thereof.

16. A semiconductor flip chip package, comprising:
   a carrier substrate; and
   a flip chip mounted on said carrier substrate, said flip chip comprising a first input/output (I/O) pad and a second I/O pad on an active surface of said flip chip, wherein a switching between said first I/O pad and said second I/O pad is implemented by wire bonding at a first surface of said carrier substrate.

17. The semiconductor flip chip package according to claim 16 further comprising:
   a first input/output (I/O) terminal of said semiconductor flip chip package; and
   a bond wire;
   wherein said flip chip electrically couples to said carrier substrate by a plurality of interconnections including a first interconnection and a second interconnection, and to achieve said switching, said bond wire selectively couples said first I/O terminal to said first interconnection corresponding to said first I/O pad or said second interconnection corresponding to said second I/O pad at said first surface of said carrier substrate.

18. The semiconductor flip chip package according to claim 17, wherein
   said first interconnection comprises:
      a first bump electrically coupled to said flip chip; and
      a first pad on said first surface of said carrier substrate, wherein said first pad is electrically coupled to said first bump; and
   said second interconnection comprises:
      a second bump electrically coupled to said flip chip; and
      a second pad on said first surface of said carrier substrate, wherein said second pad is electrically coupled to said second bump;

wherein said bond wire selectively couples said first pad or said second pad to said first I/O terminal.

19. The semiconductor flip chip package according to claim 18, further comprising:
   a first wire-bonding finger on said first surface of said carrier substrate electrically coupled to said first pad;
   a second wire-bonding finger on said first surface of said carrier substrate electrically coupled to said first I/O terminal; and
   a third wire-bonding finger on said first surface of said carrier substrate electrically coupled to said second pad;
   wherein said bond wire is selectively coupled between said first wire-bonding finger and said second wire-bonding finger or between said third wire-bonding finger and said second wire-bonding finger.

20. The semiconductor flip chip package according to claim 17 further comprising:
   a second I/O terminal of said semiconductor flip chip package;
   wherein said bond wire selectively couples said first I/O terminal or said second I/O terminal to said first interconnection at said first surface of said carrier substrate.

21. The semiconductor flip chip package according to claim 17 wherein said first I/O terminal is a solder ball disposed on a second surface of said carrier substrate.

22. The semiconductor flip chip package according to claim 21 wherein said carrier substrate is a printed wiring board.

23. The semiconductor flip chip package according to claim 17 wherein said bond wire is made of aluminum, copper, gold or a combination thereof.

* * * * *